United States Patent
Katkar et al.

(10) Patent No.: US 12,153,222 B2
(45) Date of Patent: Nov. 26, 2024

(54) BONDED OPTICAL DEVICES

(71) Applicant: ADEIA SEMICONDUCTOR BONDING TECHNOLOGIES INC., San Jose, CA (US)

(72) Inventors: Rajesh Katkar, Milpitas, CA (US); Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/360,193

(22) Filed: Jul. 27, 2023

(65) Prior Publication Data

US 2024/0103274 A1 Mar. 28, 2024

Related U.S. Application Data

(63) Continuation of application No. 17/124,408, filed on Dec. 16, 2020, now Pat. No. 11,762,200.

(Continued)

(51) Int. Cl.
*G02B 27/01* (2006.01)
*G02B 27/10* (2006.01)
(Continued)

(52) U.S. Cl.
CPC ....... *G02B 27/0172* (2013.01); *G02B 27/102* (2013.01); *G02B 27/141* (2013.01); *H01L 25/0753* (2013.01); *G02B 2027/0178* (2013.01)

(58) Field of Classification Search
None
See application file for complete search history.

(56) References Cited

U.S. PATENT DOCUMENTS

| | | | |
|---|---|---|---|
| 4,998,665 | A | 3/1991 | Hayashi |
| 5,015,052 | A | 5/1991 | Ridgway et al. |

(Continued)

FOREIGN PATENT DOCUMENTS

| | | |
|---|---|---|
| CN | 106206872 A | 12/2016 |
| EP | 1 441 410 B1 | 4/2006 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Bao-Luan Q Le
*Assistant Examiner* — Danell L Owens
(74) *Attorney, Agent, or Firm* — Knobbe, Martens, Olson & Bear, LLP

(57) ABSTRACT

A bonded optical device is disclosed. The bonded optical device can include a first optical element, a second optical element, and an optical pathway. The first optical element has a first array of optical emitters configured to emit light of a first color. The first optical element is bonded to at least one processor element, the at least one processor element including active circuitry configured to control operation of the first optical element. The second optical element has a second array of optical emitters configured to emit light of a second color different from the first color. The second optical element is bonded to the at least one processor element. The optical pathway is optically coupled with the first and second optical elements. The optical pathway is configured to transmit a superposition of light from the first and second optical emitters to an optical output to be viewed by users.

20 Claims, 10 Drawing Sheets

Related U.S. Application Data

(60) Provisional application No. 62/949,312, filed on Dec. 17, 2019.

(51) Int. Cl.
*G02B 27/14* (2006.01)
*H01L 25/075* (2006.01)

(56) References Cited

U.S. PATENT DOCUMENTS

| | | | |
|---|---|---|---|
| 5,087,585 A | 2/1992 | Hayashi | |
| 5,225,797 A | 7/1993 | Schary et al. | |
| 5,322,593 A | 6/1994 | Hasegawa et al. | |
| 5,363,464 A | 11/1994 | Way et al. | |
| 5,408,053 A | 4/1995 | Young | |
| 5,471,090 A | 11/1995 | Deutsch et al. | |
| 5,753,536 A | 5/1998 | Sugiyama et al. | |
| 5,771,555 A | 6/1998 | Eda et al. | |
| 5,785,874 A | 7/1998 | Eda | |
| 5,818,631 A | 10/1998 | Askinazi et al. | |
| 5,985,739 A | 11/1999 | Plettner et al. | |
| 5,998,808 A | 12/1999 | Matsushita | |
| 6,008,126 A | 12/1999 | Leedy | |
| 6,080,640 A | 6/2000 | Gardner et al. | |
| 6,084,714 A | 7/2000 | Ushiyama et al. | |
| 6,108,472 A | 8/2000 | Rickman et al. | |
| 6,115,264 A | 9/2000 | Nosaka | |
| 6,242,324 B1 | 6/2001 | Kub et al. | |
| 6,265,775 B1 | 7/2001 | Seyyedy | |
| 6,300,161 B1 | 10/2001 | Goetz et al. | |
| 6,374,770 B1 | 4/2002 | Lee | |
| 6,404,550 B1 | 6/2002 | Yajima | |
| 6,418,029 B1 | 7/2002 | McKee et al. | |
| 6,423,640 B1 | 7/2002 | Lee et al. | |
| 6,429,532 B1 | 8/2002 | Han et al. | |
| 6,442,321 B1 | 8/2002 | Berini | |
| 6,465,892 B1 | 10/2002 | Suga | |
| 6,614,960 B2 | 9/2003 | Berini | |
| 6,638,808 B1 | 10/2003 | Ochi | |
| 6,713,871 B2 | 3/2004 | Searls et al. | |
| 6,759,692 B1 | 7/2004 | Ochi | |
| 6,762,796 B1 | 7/2004 | Nakajoh et al. | |
| 6,782,179 B2 | 8/2004 | Bozhevolnyi et al. | |
| 6,801,691 B2 | 10/2004 | Berini | |
| 6,868,258 B2 | 3/2005 | Hayata et al. | |
| 6,887,769 B2 | 5/2005 | Kellar et al. | |
| 6,908,027 B2 | 6/2005 | Tolchinsky et al. | |
| 6,908,832 B2 | 6/2005 | Farrens et al. | |
| 6,936,854 B2 | 8/2005 | Iwasaki et al. | |
| 6,962,835 B2 | 11/2005 | Tong et al. | |
| 7,010,183 B2 | 3/2006 | Estes et al. | |
| 7,045,453 B2 | 5/2006 | Canaperi et al. | |
| 7,060,634 B2 | 6/2006 | Rantala et al. | |
| 7,078,811 B2 | 7/2006 | Suga | |
| 7,105,980 B2 | 9/2006 | Abbott et al. | |
| 7,126,212 B2 | 10/2006 | Enquist et al. | |
| 7,144,827 B2 | 12/2006 | Rantala et al. | |
| 7,193,423 B1 | 3/2007 | Dalton et al. | |
| 7,339,798 B2 | 3/2008 | Chakravorty | |
| 7,354,798 B2 | 4/2008 | Pogge et al. | |
| 7,355,836 B2 | 4/2008 | Radhakrishnan et al. | |
| 7,547,954 B2 | 6/2009 | Geusic et al. | |
| 7,614,771 B2 | 11/2009 | McKechnie et al. | |
| 7,626,216 B2 | 12/2009 | McKinzie, III | |
| 7,705,691 B2 | 4/2010 | Lu et al. | |
| 7,736,945 B2 | 6/2010 | Schiaffino et al. | |
| 7,741,724 B2 | 6/2010 | Morikawa et al. | |
| 7,746,663 B2 | 6/2010 | Hashimoto | |
| 7,750,488 B2 | 7/2010 | Patti et al. | |
| 7,791,429 B2 | 9/2010 | Chen et al. | |
| 7,803,693 B2 | 9/2010 | Trezza | |
| 8,009,763 B2 | 8/2011 | Risk et al. | |
| 8,130,821 B2 | 3/2012 | Hopkins et al. | |
| 8,153,505 B2 | 4/2012 | Tong et al. | |
| 8,183,127 B2 | 5/2012 | Patti et al. | |
| 8,211,722 B2 | 7/2012 | Lu | |
| 8,241,961 B2 | 8/2012 | Kim et al. | |
| 8,300,312 B2 | 10/2012 | Kobayashi et al. | |
| 8,314,007 B2 | 11/2012 | Vaufredaz | |
| 8,349,635 B1 | 1/2013 | Gan et al. | |
| 8,357,931 B2 | 1/2013 | Schieck et al. | |
| 8,377,798 B2 | 2/2013 | Peng et al. | |
| 8,436,457 B2 | 5/2013 | Crisp et al. | |
| 8,441,111 B2 | 5/2013 | Crisp et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,483,253 B2 | 7/2013 | Budd et al. | |
| 8,501,537 B2 | 8/2013 | Sadaka et al. | |
| 8,524,533 B2 | 9/2013 | Tong et al. | |
| 8,558,636 B2 | 10/2013 | Shin et al. | |
| 8,620,164 B2 | 12/2013 | Heck et al. | |
| 8,647,987 B2 | 2/2014 | Yang et al. | |
| 8,657,448 B2 | 2/2014 | Kobayashi et al. | |
| 8,697,493 B2 | 4/2014 | Sadaka | |
| 8,698,323 B2 | 4/2014 | Mohammed et al. | |
| 8,716,105 B2 | 5/2014 | Sadaka et al. | |
| 8,764,197 B2 | 7/2014 | Kobayashi | |
| 8,802,538 B1 | 8/2014 | Liu | |
| 8,809,123 B2 | 8/2014 | Liu et al. | |
| 8,841,002 B2 | 9/2014 | Tong | |
| 8,865,489 B2 | 10/2014 | Rogers et al. | |
| 8,916,448 B2 | 12/2014 | Cheng et al. | |
| 8,929,077 B2 | 1/2015 | Gouramanis | |
| 8,988,299 B2 | 3/2015 | Kam et al. | |
| 9,022,571 B2 | 5/2015 | Kawase et al. | |
| 9,093,350 B2 | 7/2015 | Endo et al. | |
| 9,142,517 B2 | 9/2015 | Liu | |
| 9,171,756 B2 | 10/2015 | Enquist et al. | |
| 9,179,584 B2 | 11/2015 | La Porta et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,263,186 B2 | 2/2016 | Li et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,391,143 B2 | 7/2016 | Tong et al. | |
| 9,394,161 B2 | 7/2016 | Cheng et al. | |
| 9,431,368 B2 | 8/2016 | Enquist et al. | |
| 9,434,145 B2 | 9/2016 | Erdogan et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,202 B2 | 11/2016 | Hashimoto | |
| 9,496,239 B1 | 11/2016 | Edelstein et al. | |
| 9,536,848 B2 | 1/2017 | England et al. | |
| 9,537,199 B2 | 1/2017 | Dang et al. | |
| 9,551,880 B2 | 1/2017 | Amitai | |
| 9,559,081 B1 | 1/2017 | Lai et al. | |
| 9,618,834 B2 | 4/2017 | Miyabara et al. | |
| 9,620,481 B2 | 4/2017 | Edelstein et al. | |
| 9,625,713 B2 | 4/2017 | Helie et al. | |
| 9,656,852 B2 | 5/2017 | Cheng et al. | |
| 9,671,572 B2 | 6/2017 | Decker et al. | |
| 9,711,694 B2 | 7/2017 | Robin et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,744,754 B2 | 8/2017 | Wakamatsu et al. | |
| 9,799,587 B2 | 10/2017 | Fujii et al. | |
| 9,847,458 B2 | 12/2017 | Lee et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,935,088 B2 | 4/2018 | Budd et al. | |
| 9,941,241 B2 | 4/2018 | Edelstein et al. | |

(56) References Cited

U.S. PATENT DOCUMENTS

| | | |
|---|---|---|
| 9,941,243 B2 | 4/2018 | Kim et al. |
| 9,953,941 B2 | 4/2018 | Enquist |
| 9,960,142 B2 | 5/2018 | Chen et al. |
| 9,960,152 B2 | 5/2018 | Bono et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,487 B2 | 10/2019 | Huang et al. |
| 10,446,532 B2 | 10/2019 | Uzoh et al. |
| 10,475,778 B2 | 11/2019 | Pfeuffer et al. |
| 10,508,030 B2 | 12/2019 | Katkar et al. |
| 10,522,499 B2 | 12/2019 | Enquist et al. |
| 10,571,699 B1 | 2/2020 | Parsons et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,624,882 B2 | 4/2023 | Pezeshki et al. |
| 11,715,730 B2 | 8/2023 | Tao et al. |
| 11,762,200 B2 | 9/2023 | Katkar et al. |
| 11,860,415 B2 | 1/2024 | Huang et al. |
| 2002/0000328 A1 | 1/2002 | Motomura et al. |
| 2002/0003307 A1 | 1/2002 | Suga |
| 2002/0025101 A1 | 2/2002 | Kaatz |
| 2002/0131715 A1 | 9/2002 | Brady |
| 2003/0081906 A1 | 5/2003 | Filhaber et al. |
| 2003/0168716 A1 | 9/2003 | Lee et al. |
| 2004/0071424 A1 | 4/2004 | Hiraka et al. |
| 2004/0084414 A1 | 5/2004 | Sakai et al. |
| 2004/0149991 A1 | 8/2004 | Won |
| 2004/0155692 A1 | 8/2004 | Ochi |
| 2004/0157407 A1 | 8/2004 | Tong et al. |
| 2004/0207043 A1 | 10/2004 | Matsunaga et al. |
| 2004/0226910 A1 | 11/2004 | Chatterjee et al. |
| 2005/0063134 A1 | 3/2005 | Kim et al. |
| 2005/0063437 A1 | 3/2005 | Horng et al. |
| 2005/0135041 A1 | 6/2005 | Kang et al. |
| 2005/0190808 A1 | 9/2005 | Yonekura et al. |
| 2005/0226299 A1 | 10/2005 | Horng et al. |
| 2005/0231303 A1 | 10/2005 | Chang et al. |
| 2006/0012966 A1 | 1/2006 | Chakravorty |
| 2006/0017144 A1 | 1/2006 | Uematsu et al. |
| 2006/0057945 A1 | 3/2006 | Hsu et al. |
| 2006/0145778 A1 | 7/2006 | Pleva et al. |
| 2007/0045814 A1 | 3/2007 | Yamamoto et al. |
| 2007/0085165 A1 | 4/2007 | Oh et al. |
| 2007/0096130 A1 | 5/2007 | Schiaffino et al. |
| 2007/0096294 A1 | 5/2007 | Ikeda et al. |
| 2007/0111386 A1 | 5/2007 | Kim et al. |
| 2007/0147014 A1 | 6/2007 | Chang et al. |
| 2007/0222048 A1 | 9/2007 | Huang |
| 2007/0295456 A1 | 12/2007 | Gudeman et al. |
| 2008/0124835 A1 | 5/2008 | Chen et al. |
| 2008/0150821 A1 | 6/2008 | Koch et al. |
| 2009/0009103 A1 | 1/2009 | McKechnie et al. |
| 2009/0052827 A1 | 2/2009 | Durfee et al. |
| 2009/0165854 A1 | 7/2009 | Yamazaki et al. |
| 2009/0206962 A1 | 8/2009 | Chou et al. |
| 2009/0242252 A1 | 10/2009 | Tanaka |
| 2010/0317132 A1 | 12/2010 | Rogers et al. |
| 2011/0018657 A1 | 1/2011 | Cheng et al. |
| 2011/0024918 A1 | 2/2011 | Brunnbauer et al. |
| 2011/0059275 A1 | 3/2011 | Stark |
| 2011/0113828 A1 | 5/2011 | Matsumoto |
| 2011/0115579 A1 | 5/2011 | Rofougaran |
| 2011/0165707 A1 | 7/2011 | Lott et al. |
| 2011/0290552 A1 | 12/2011 | Palmateer et al. |
| 2011/0294242 A1 | 12/2011 | Lu |
| 2012/0013013 A1 | 1/2012 | Sadaka et al. |
| 2012/0013499 A1 | 1/2012 | Hayata |
| 2012/0100318 A1 | 4/2012 | Danzl et al. |
| 2012/0147516 A1 | 6/2012 | Kim et al. |
| 2012/0168217 A1 | 7/2012 | Hsu et al. |
| 2012/0189317 A1 | 7/2012 | Heck et al. |
| 2012/0212384 A1 | 8/2012 | Kam et al. |
| 2013/0009183 A1 | 1/2013 | Han |
| 2013/0009325 A1 | 1/2013 | Mori et al. |
| 2013/0020666 A1 | 1/2013 | Smith |
| 2013/0063863 A1 | 3/2013 | Timler et al. |
| 2013/0072011 A1 | 3/2013 | Zhang et al. |
| 2013/0083583 A1 | 4/2013 | Crisp et al. |
| 2013/0105943 A1 | 5/2013 | Lai et al. |
| 2013/0122617 A1 | 5/2013 | Lott et al. |
| 2013/0170145 A1 | 7/2013 | Gouramanis |
| 2013/0207234 A1 | 8/2013 | Ikeda et al. |
| 2013/0250430 A1 | 9/2013 | Robbins et al. |
| 2013/0265733 A1 | 10/2013 | Herbsommer et al. |
| 2013/0286544 A1 | 10/2013 | Azais |
| 2014/0001568 A1 | 1/2014 | Wang et al. |
| 2014/0048908 A1 | 2/2014 | Chen et al. |
| 2014/0071519 A1 | 3/2014 | Chen et al. |
| 2014/0116761 A1 | 5/2014 | Lee et al. |
| 2014/0145338 A1 | 5/2014 | Fujii et al. |
| 2014/0175629 A1 | 6/2014 | Sun et al. |
| 2014/0175655 A1 | 6/2014 | Chen et al. |
| 2014/0177189 A1 | 6/2014 | Liu et al. |
| 2014/0184351 A1 | 7/2014 | Bae et al. |
| 2014/0225795 A1 | 8/2014 | Yu |
| 2014/0252635 A1 | 9/2014 | Tran et al. |
| 2014/0264751 A1 | 9/2014 | Chen et al. |
| 2014/0264948 A1 | 9/2014 | Chou et al. |
| 2014/0294342 A1 | 10/2014 | Offriein et al. |
| 2014/0370658 A1 | 12/2014 | Tong et al. |
| 2014/0377946 A1 | 12/2014 | Cha et al. |
| 2015/0021626 A1 | 1/2015 | Nakamura et al. |
| 2015/0064498 A1 | 3/2015 | Tong |
| 2015/0097298 A1 | 4/2015 | Chen et al. |
| 2015/0179539 A1 | 6/2015 | Tamai |
| 2015/0194379 A1 | 7/2015 | Chen et al. |
| 2015/0206902 A1 | 7/2015 | Cheng et al. |
| 2015/0221571 A1 | 8/2015 | Chaparala et al. |
| 2015/0235952 A1 | 8/2015 | Pan et al. |
| 2015/0270209 A1 | 9/2015 | Woychik et al. |
| 2015/0318618 A1 | 11/2015 | Chen et al. |
| 2015/0328875 A1 | 11/2015 | Hattori et al. |
| 2016/0027765 A1 | 1/2016 | von Malm et al. |
| 2016/0070078 A1 | 3/2016 | Budd et al. |
| 2016/0077294 A1 | 3/2016 | Jou et al. |
| 2016/0111404 A1 | 4/2016 | Sanders et al. |
| 2016/0116673 A1 | 4/2016 | Budd et al. |

(56) References Cited

U.S. PATENT DOCUMENTS

| | | |
|---|---|---|
| 2016/0141469 A1 | 5/2016 | Robin et al. |
| 2016/0155677 A1 | 6/2016 | Bonart et al. |
| 2016/0181477 A1 | 6/2016 | Lee et al. |
| 2016/0197630 A1 | 7/2016 | Kawasaki |
| 2016/0233195 A1 | 8/2016 | Nagai |
| 2016/0254345 A1 | 9/2016 | Singh et al. |
| 2016/0291265 A1 | 10/2016 | Kinghorn et al. |
| 2016/0309578 A1 | 10/2016 | Park |
| 2016/0343682 A1 | 11/2016 | Kawasaki |
| 2016/0372449 A1 | 12/2016 | Rusu et al. |
| 2017/0019086 A1 | 1/2017 | Dueweke |
| 2017/0047312 A1 | 2/2017 | Budd et al. |
| 2017/0062409 A1 | 3/2017 | Basker et al. |
| 2017/0069609 A1 | 3/2017 | Zhang et al. |
| 2017/0148777 A1 | 5/2017 | Bono et al. |
| 2017/0179029 A1 | 6/2017 | Enquist et al. |
| 2017/0186670 A1 | 6/2017 | Budd et al. |
| 2017/0186730 A1 | 6/2017 | Shen et al. |
| 2017/0194271 A1 | 7/2017 | Hsu et al. |
| 2017/0207600 A1 | 7/2017 | Klamkin et al. |
| 2017/0213502 A1* | 7/2017 | Henry ............... G09G 3/2003 |
| 2017/0315299 A1 | 11/2017 | Mathai et al. |
| 2017/0330858 A1 | 11/2017 | Lee et al. |
| 2017/0331050 A1 | 11/2017 | Yagi et al. |
| 2017/0338214 A1 | 11/2017 | Uzoh et al. |
| 2017/0343498 A1 | 11/2017 | Kalnitsky et al. |
| 2018/0074322 A1 | 3/2018 | Rousseau et al. |
| 2018/0120568 A1 | 5/2018 | Miller et al. |
| 2018/0156965 A1 | 6/2018 | El-Ghouroury et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0261645 A1 | 9/2018 | Na et al. |
| 2018/0277523 A1 | 9/2018 | Ahmed et al. |
| 2018/0323177 A1 | 11/2018 | Yu et al. |
| 2018/0323227 A1 | 11/2018 | Zhang et al. |
| 2018/0331000 A1 | 11/2018 | DeLaCruz et al. |
| 2018/0331066 A1 | 11/2018 | Uzoh et al. |
| 2018/0358332 A1 | 12/2018 | Kim |
| 2019/0018245 A1 | 1/2019 | Cheng et al. |
| 2019/0088633 A1 | 3/2019 | Tao et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198409 A1 | 6/2019 | Katkar et al. |
| 2019/0227320 A1 | 7/2019 | Bonar et al. |
| 2019/0265411 A1 | 8/2019 | Huang et al. |
| 2019/0287949 A1 | 9/2019 | Chong et al. |
| 2019/0309936 A1 | 10/2019 | Kondo et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0194614 A1 | 6/2020 | Pares |
| 2020/0194635 A1 | 6/2020 | Yuasa et al. |
| 2020/0227367 A1 | 7/2020 | Haba et al. |
| 2020/0235085 A1 | 7/2020 | Tao et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2020/0411587 A1 | 12/2020 | Pezeshki et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0265331 A1 | 8/2021 | Wang et al. |
| 2021/0288037 A1 | 9/2021 | Tao et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0043209 A1 | 2/2022 | Huang et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0155490 A1 | 5/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0317703 A1 | 10/2023 | Tao et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0063199 A1 | 2/2024 | Tao et al. |
| 2024/0079376 A1 | 3/2024 | Suwito et al. |
| 2024/0105674 A1 | 3/2024 | Uzoh et al. |
| 2024/0118492 A1 | 4/2024 | Huang et al. |
| 2024/0170411 A1 | 5/2024 | Chang et al. |
| 2024/0186248 A1 | 6/2024 | Haba et al. |

(56) References Cited

U.S. PATENT DOCUMENTS

| | | |
|---|---|---|
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |

FOREIGN PATENT DOCUMENTS

| | | |
|---|---|---|
| JP | 60-257413 A | 12/1985 |
| JP | 10-189671 A | 7/1998 |
| JP | 2000-100679 | 4/2000 |
| JP | 2001-102479 | 4/2001 |
| JP | 2002-353416 | 12/2002 |
| JP | 2003-043281 | 2/2003 |
| JP | 2005086044 A | 3/2005 |
| JP | 2005123522 A | 5/2005 |
| JP | 2006-276313 A | 10/2006 |
| JP | 2007-041117 | 2/2007 |
| JP | 2008-258258 | 10/2008 |
| JP | 2010-276940 | 12/2010 |
| JP | 2013-33786 | 2/2013 |
| JP | 2017-177519 | 10/2017 |
| JP | 2018-160519 | 10/2018 |
| JP | 2019192888 A | 10/2019 |
| KR | 10-2006-0105797 | 10/2006 |
| KR | 10-2015-0097798 | 8/2015 |
| WO | WO 2002/075387 A2 | 9/2002 |
| WO | WO 2005/043584 A2 | 5/2005 |
| WO | WO 2005/064646 A2 | 7/2005 |
| WO | WO 2006/100444 A1 | 9/2006 |
| WO | WO 2012/125237 A2 | 9/2012 |
| WO | WO 2016/057259 A1 | 4/2016 |
| WO | WO 2017/089676 A1 | 6/2017 |
| WO | WO 2017/151442 A1 | 9/2017 |
| WO | WO 2018/223150 A1 | 12/2018 |
| WO | WO 2019/143413 A1 | 7/2019 |

OTHER PUBLICATIONS

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p—Si/n—InP wafers through surface activated bonding method at room temperature," Indium Phosphide and Related Materials, 2001, IEEE International Conference On, pp. 272-275.

Howlader et al., "Characterization of the bonding strength and interface current of p—Si/ n—InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p—SionGaAs wafers bonded by surface activated bonding at room temperature," J. Vac. Sci. Technol. B 19, Nov./Dec. 2001, pp. 2114-2118.

International Search Report and Written Opinion mailed Apr. 26, 2021, issued in International Application No. PCT/US2020/065544, 11 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.

Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—CU, Cu—Si, and Cu—SiO2 at low temperature," Proceedings—Electrochemical Society, 2003, vol. 19, pp. 239-247.

Kim, H. et al., "A wideband on-interposer passive equalizer design for chip-to-chip 30-GB/s serial data transmission," IEEE Transactions on Components, Packaging and Manufacturing Technology, Jan. 2015, vol. 5, Issue 1, pp. 28-39.

Lee, H. et al., "Signal integrity of bump-less high-speed through silicon via channel for terabyte/s bandwidth 2.5D IC," 2016 IEEE 66th Electronic Components and Technology Conference, Aug. 18, 2016.

Matsuzawa et al., "Room-temperature interconnection of electroplated Au microbump by means of surface activated bonding method," Electronic Components and Technology Conference, 2001, 51st Proceedings, IEEE, pp. 384-387.

Moriceau, H. et al., "Overview of recent direct wafer bonding advances and applications," Adv Nat Sciences: Nanoscience and Nanotechnology, Dec. 2010;1(4):043004; 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

(56) References Cited

OTHER PUBLICATIONS

Plössl, A. et al., "Wafer direct bonding: tailoring adhesion between brittle materials," Materials Science and Engineering: R: Reports. Mar. 10, 1999;25(1-2):1-88.

Reiche et al., "The effect of a plasma pretreatment on the Si/Si bonding behaviour," Electrochemical Society Proceedings, 1998, vol. 97-36, pp. 437-444.

Roberds et al., "Low temperature, in situ, plasma activated wafer bonding," Electrochemical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Conference, 51st Proceedings, 2001, IEEE, pp. 755-760.

Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mechanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of argon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectromechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump-Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Westphal, W.B. et al., "Dielectric constant and loss data," Air Force Materials Laboratory, Apr. 1972.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Bush, Steve, "Electronica: Automotive power modules from On Semi," ElectronicsWeekly.com, indicating an OnSemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Extended European Search Report mailed Dec. 19, 2023, European Application No. 20902963.6, 8 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

OnSemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, Electronics Weekly.com ("BUSH article"); however, the imaged part and the part shown in the BUSH article share the part number "OnSemi AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

Avicena Tech Corp., "Avicena Raises $25 Million in Series A to Fund Development of High Capacity microLED-based Optical Interconnects", Press Release: Aug. 2, 2022, https://avicena.tech/press-release-08-02-2022/, 4 pages.

(56) References Cited

OTHER PUBLICATIONS

Morgan T.P., "NVIDIA Shows What Optically Linked GPU Systems might look like", The Next Platform, Aug. 17, 2022; https://www.nextplatform.com/2022/08/17/nvidia-shows-what-optically-linked-gpu-systems-might-look-like/, 13 pages.
Gordillo O.A.J. et al., "Plug-and-play fiber to waveguide connector", Optics express. Jul. 22, 2019;27(15):20305-10.

* cited by examiner

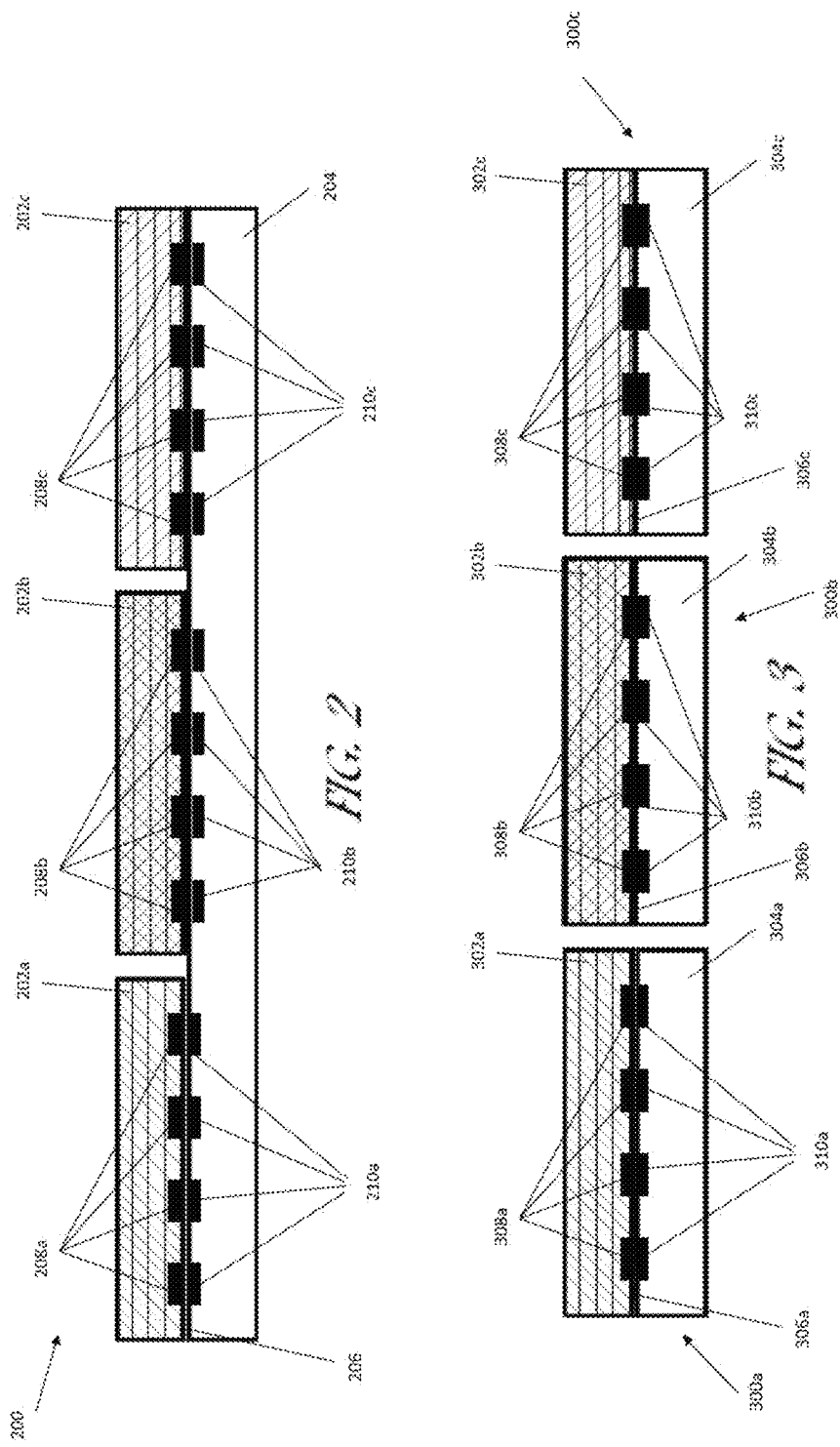

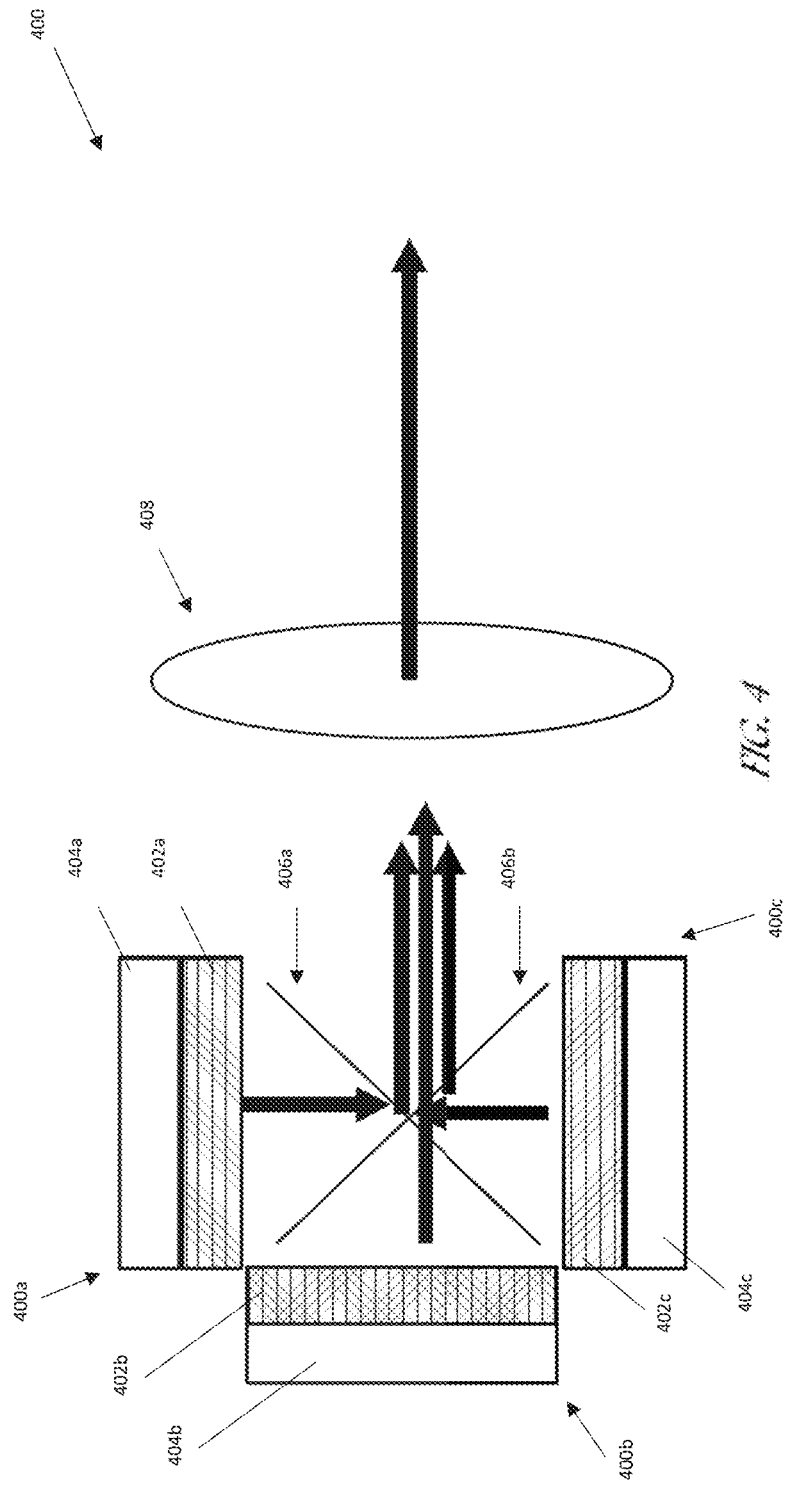

BONDED OPTICAL DEVICES

INCORPORATION BY REFERENCE TO ANY PRIORITY APPLICATIONS

This application claims priority to U.S. Provisional Patent Application No. 62/949,312, filed Dec. 17, 2019, and U.S. patent application Ser. No. 17/124,408, filed Dec. 16, 2020, the entire contents of which are hereby incorporated by reference in their entirety and for all purposes.

BACKGROUND

Field of the Invention

The field relates to bonded optical devices and, in particular, to bonded optical devices for use in wearable electronics.

Description of the Related Art

In some types of display devices, a very small and extremely high resolution device is desirable. Examples include directly viewed display screens, such as smart watches and cell phone displays, as well as applications with projected images from small screens, such as heads-up displays (HUDs) and smart glasses. For example, in wearable smart glasses, such as augmented reality (AR) glasses, or other eyewear that includes electronic circuitry and a display, the image may be positioned less than 1-2 cm (e.g., 1-1.2 cm) from the user's eye. In such devices, it can be desirable to utilize a pitch for the display pixels that are as small as possible (e.g., less than 5-6 μm), for example, in order to provide a desired quality of image. Some technologies, such as liquid crystal-on-silicon (LCoS) may be able to provide pixels with low pitches, but are inefficient in that an insignificant amount of optical energy (e.g., light) is lost, may have low manufacturing yield, lower resolution and may be expensive.

Other technologies such as micro light emitting diodes (microLED) are capable of providing very bright images for AR/MR (Mixed Reality) applications because they can provide a sufficient amount of optical energy (e.g., brightness) to provide, e.g., a clear image visible in well-lit ambiance. Light Emitting Diode (LED) wafers can be processed for one wavelength of light at a time (red "R", green "G" or blue "B"), and making a multi-colored display still poses a challenge against providing a desired level of image quality in the aforementioned applications.

Accordingly, there remains a continuing need for improved optical devices, for example to create a colored image from monochromatic LED displays and integrate these monochromatic microLED displays for applications such as AR smart glasses, projection systems, car HUDs, smart watch displays, cell phone displays, etc.

BRIEF DESCRIPTION OF THE DRAWINGS

Specific implementations will now be described with reference to the following drawings, which are provided by way of example, and not limitation.

FIG. 2 is a schematic side sectional view of directly bonded optical devices, according to an embodiment.

FIG. 3 is a schematic side sectional view of directly bonded optical devices, according to another embodiment.

FIG. 4 is a schematic side sectional view of an optical assembly, according to an embodiment.

DETAILED DESCRIPTION

Figure 1:
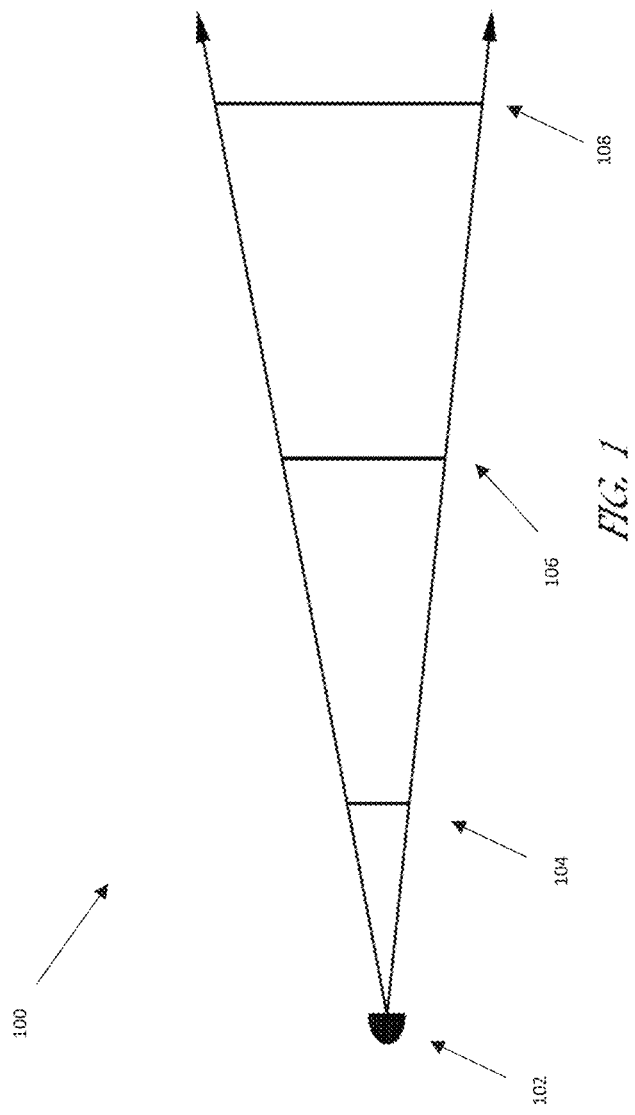
FIG. 1 is a diagram showing an illustration of relative distances between a display device and a user's eye.

FIG. 1 is a diagram showing an illustration 100 of the relative display distances between various display devices 104, 106, 108 and a user's eye 102. The most sensitive part of the eye, fovea, contains the most cones (which help us identify colors), and has a resolution of ~1 arc-minute, which is 60 pixels-per-degree (PPD). PPD identifies the pixel pitch needed in a display based on a distance of the display device from the user's eye 102. For an AR smart glass display 104 with working distance of ~1 cm from the user's eye 102, a pixel pitch of ~5lim produces what is perceived as a "clear image." For a cell phone display 106 with a working distance of ~20 cm from the user's eye 102, a pixel pitch of ~50 μm produces a clear image. For a computer display 108 with a working distance of ~50 cm from the user's eye 102, a pixel pitch of ~300 μm produces a clear image. Digital Light Processing (DLP) and liquid crystal-on-silicon (LCoS) based technologies are not sufficient for several reasons, including, e.g., low brightness, pixel size, pitch, display size, etc. Accordingly, microLED devices may be beneficial in some applications, such as AR display applications.

Various embodiments disclosed herein relate to bonded optical devices 200, 300a-c (shown in, e.g., FIGS. 2 and 3). As explained herein, some types of optical elements 202a-c, 302a-c (shown in, e.g., FIGS. 2 and 3), particularly light emitting elements (e.g., light emitting diodes, or LEDs), may be fabricated in wafers having devices configured to emit light of a single color (e.g., red, green, or blue), which can make fabrication of multi-colored displays comprised of several hundred thousand or millions of LEDs from these separate wafers, challenging. In various embodiments, the optical elements 202a-c, 302a-c can be formed of a semiconductor material. For example, optical wafers (such as LED wafers) can be formed from a Group III-V compound semiconductor material(s), such as InP, GaN, AlGaAs, InGaN, AlGaInP, etc. In various embodiments, direct bonding procedures can enable such compound semiconductor materials to be bonded to a different type of semiconductor processor element (e.g., a Si or CMOS processor die), creating a heterogenous system. Furthermore, it can be challenging to provide optical elements 202a-c, 302a-c (shown in, e.g., FIGS. 2 and 3) that have pixels 602a-c (shown in, e.g., FIG. 6) (or display regions) having a sufficiently small pitch (e.g., space between pixels) for displaying high quality and high brightness images to be directly viewed or projected on displays (such as small displays or displays configured to be positioned close to the user). In various embodiments, a pitch of the optical emitters of an array can be less than 50 microns, e.g., less than 10 microns.

In some microLED displays, each pixel 704 (shown in, e.g., FIG. 7A) can utilize individual LED chips (e.g., optical elements) as a pixel 704 (shown in, e.g., FIG. 7A) or sub-pixel. For example, microLED chips (e.g., optical elements including array(s) of emitters) can be separately manufactured and positioned with pick-and-place techniques. Transfer and placement techniques and color conversion schemes can also be used but these techniques may not be economical or may be very lossy. Accordingly, there remains a continuing need for improved optical devices.

Embodiments disclosed herein can enable displays having a fine pixel pitch by bonding (e.g., directly bonding or hybrid bonding) an optical element 202a-c, 302a-c (shown in, e.g., FIGS. 2 and 3) (particularly a light emitting element such as an LED device including a plurality of LEDs) to at least one carrier 204, 304a-c (shown in, e.g., FIGS. 2 and 3), such as a processor, e.g., an image processor element that can include active circuitry (e.g., one or more transistors) configured to control the operation of the optical element 202a-c, 302a-c (shown in, e.g., FIGS. 2 and 3). In various embodiments, the optical emitters of the emitter arrays can be independently controllable. Beneficially, in some embodiments, direct bonding or hybrid bonding can be used to physically and electrically connect the optical element 202a-c, 302a-c (shown in, e.g., FIGS. 2 and 3) to the carrier 204, 304a-c (shown in, e.g., FIGS. 2 and 3) (e.g., processor element) without an adhesive. The use of direct bonding can enable pixel pitches of less than 5 microns, or less than 1 micron. The at least one carrier 204, 304a-c has a coefficient of thermal expansion (CTE) less than 7 ppm.

FIG. 2 is a schematic side sectional view of a bonded optical device 200 in which a plurality of optical elements 202a-c are bonded (e.g., directly bonded) to a common carrier 204 according to one embodiment. In some embodiments, the common carrier 204 can comprise an integrated device die, such as a processor die having circuitry that controls operation of the optical elements 202a-202c. FIG. 3 is a schematic side sectional view of a plurality of bonded optical devices 300a-c in which a plurality of optical elements 302a-c are bonded (e.g., directly bonded) to a corresponding plurality of carriers 304a-c. The optical elements can be manufactured in wafer form and singulated to define the optical elements 202a-c, 302a-c shown in FIGS. 2-3. As shown in FIG. 2, the optical elements 202a-c (which can comprise emitter dies, such as LEDs) can be directly bonded to a common carrier 204 without an intervening adhesive, in for example a die-to-wafer (D2W) process. In some embodiments (see, e.g., FIG. 11), the optical elements 202a-c, 302a-c and carrier 204, 304a-c can be integrated into a larger optical system. For example, the bonded optical device 200 (including, e.g., the optical elements 202a-c and the common carrier 204 directly bonded thereto) can be mounted to a waveguide or other structure.

In other embodiments, the carrier 304a-c can be singulated to form a plurality of bonded optical devices 300a-c, as shown in FIG. 3. In other embodiments, the singulated optical elements 302a-c can be bonded to the singulated carriers 304a-c in a die-to-die (D2D) process to obtain the bonded optical devices 300a-c shown in FIG. 3. In still other embodiments, the optical elements in wafer form (not shown) can be bonded (e.g., directly bonded) to the carrier in wafer form (not shown) (e.g., processor wafer) in a wafer-to-wafer (W2W) process (not shown). The bonded wafers can then be singulated to form a plurality of bonded optical devices 300a-c.

The optical element(s) 202a-c, 302a-c can be directly bonded (e.g., using dielectric-to-dielectric bonding techniques, such as the ZiBond®, DBI or DBI Ultra techniques used by Xperi Corporation of San Jose, California) to the at least one carrier 204, 304a-c (such as a processor element) without an adhesive. For example, the dielectric-to-dielectric bonds may be formed without an adhesive using the direct bonding techniques disclosed at least in U.S. Pat. Nos. 9,391,143 and 10,434,749, the entire contents of each of which are incorporated by reference herein in their entirety and for all purposes.

In various embodiments, the direct bonds can be formed without an intervening adhesive. For example, dielectric bonding surfaces 206, 306a-c can be polished to a high degree of smoothness. The bonding surfaces 206, 306a-c can be cleaned and exposed to a plasma and/or etchants to activate the surfaces. In some embodiments, the surfaces can be terminated with a species after activation or during activation (e.g., during the plasma and/or etch processes). In various embodiments, the terminating species can comprise nitrogen. Further, in some embodiments, the bonding surfaces can be exposed to fluorine. For example, there may be one or multiple fluorine peaks near layer and/or bonding interfaces. Without being limited by theory, in some embodiments, the activation process can be performed to break chemical bonds at the bonding surface, and the termination process can provide additional chemical species at the bonding surface that improves the bonding energy during direct bonding. Thus, in the directly bonded structures, the bonding interface between two dielectric materials can comprise a very smooth interface with higher nitrogen content and/or fluorine peaks at the bonding interface.

In various embodiments, conductive contact pads 208a-c, 308a-c of the optical element 202a-c, 302a-c or LED element can be directly bonded to corresponding conductive contact pads 210a-c, 310a-c of the carrier 204, 304a-c (e.g., a processor element). One LED pixel within an LED chip may have two contact pads or electrodes (positive electrode and negative electrode) in various embodiments. In various embodiments, the carrier 204, 304a-c (e.g., processor element) can create identical images on the optical corresponding elements 302a-c. As explained herein, each optical element 302a-302c can comprise a monochromatic light emitting element, and can create identical images, such that, when the images are superimposed, a multi-colored image can be viewed. For example, a hybrid bonding technique can be used to provide conductor-to-conductor direct bonds along a bond interface 206, 306a-c that includes covalently direct bonded dielectric-to-dielectric surfaces. In various embodiments, the conductor-to-conductor (e.g., contact pad to contact pad) direct bonds and the dielectric-to-dielectric bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces 206, 306a-c can be prepared and directly bonded to one another without an intervening adhesive. Conductive contact pads 208a-c, 210a-c, 308a-c, 310a-c (which may be surrounded by nonconductive dielectric field regions) may also directly bond to one another without an intervening adhesive. In some embodiments, the respective contact pads 208a-c, 210a-c, 308a-c, 310a-c can be recessed below the dielectric field regions, for example, recessed by less than 20 nm, less than 15 nm, or less than 10 nm, for example, recessed in a range of 2 nm to 20 nm, or in a range of 4 nm to 10 nm. The dielectric field regions can be directly bonded to one another without an adhesive at room temperature in some embodiments and, subsequently, the bonded structure can be annealed. Upon annealing, the contact pads 208a-c, 210a-c, 308a-c, 310a-c can expand and contact one another to form a metal-to-metal direct bond. Beneficially, the use of Direct Bond Interconnect, or DBI®, and/or ZiBond techniques can enable fine pixel pitches as explained above. In some embodiments, the pitch of the bonding pads 208a-c, 210a-c, 308a-c, 310a-c may be less than 300 microns, less than 40 microns or less than 10 microns, or even less than 2 microns. For some applications the ratio of the pitch of the bonding pads 208a-c, 210a-c, 308a-c, 310a-c to one of the dimensions of the bonding pad 208a-c, 210a-c, 308a-c, 310a-c is less than 5, or less than 3 and sometimes desirably less than 2. In various embodiments, the contact pads 208a-c, 210a-c, 308a-c, 310a-c can comprise copper, although other metals may be suitable.

The embodiments disclosed herein can also be used in combination with the devices and methods disclosed throughout U.S. patent application Ser. No. 15/919,570 (which issued as U.S. Pat. No. 10,629,577 on Apr. 21, 2020); Ser. No. 16/219,693; and Ser. No. 16/176,191, the entire contents of each of which are incorporated by reference herein in their entirety and for all purposes. U.S. patent application Ser. No. 15/919,570, for example, teaches methods for direct hybrid bonding of CMOS logic wafers or dies to LED wafers or dies for direct control of the emitters (active matrix driving). U.S. application Ser. No. 16/176,191 teaches direct bonding of optically transparent substrates.

The embodiments disclosed herein can further be used in combination with the devices and methods (which describe how an optical element can be bonded to a processor die) disclosed throughout U.S. Pat. No. 10,629,577, the entire contents of which are incorporated by reference herein in their entirety and for all purposes. U.S. Pat. No. 10,629,577 teaches direct-bonded arrays of optical elements such as for example direct-bonded LED arrays.

Thus, in direct bonding processes, a first element (e.g., an optical element 202a-c, 302a-c) can be directly bonded to a second element (e.g., a carrier 204, 304a-c such as a processor die) without an intervening adhesive. In some arrangements, the first element can comprise a singulated element, such as a singulated optical device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die (e.g., a processor die). In other arrangements, the second element can comprise a substrate (e.g., a wafer).

As explained herein, the first and second elements (e.g., the optical element 202a-c, 302a-c and the carrier 204, 304a-c or processor die) can be directly bonded to one another without an adhesive, which is different from a deposition process. The first and second elements can accordingly comprise non-deposited elements. Further, directly bonded structures, unlike deposited layers, can include a defect region (not shown) along the bond interface 206, 306a-c in which nanovoids are present. The nanovoids may be formed due to activation of the bonding surfaces (e.g., exposure to a plasma). As explained above, the bond interface 206, 306a-c can include concentration of materials from the activation and/or last chemical treatment processes. For example, in embodiments that utilize a nitrogen plasma for activation, a nitrogen peak can be formed at the bond interface 206, 306a-c. In embodiments that utilize an oxygen plasma for activation, an oxygen peak can be formed at the bond interface 206, 306a-c. In some embodiments, the bond interface 206, 306a-c can comprise silicon oxide, silicon nitride, silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads 208a-c, 210a-c or 308a-c, 310a-c can be joined such that copper grains grow into each other across the bond interface 206, 306a-c. In some embodiments, the copper can have grains oriented along the crystal plane for improved copper diffusion across the bond interface 206, 306a-c. The bond interface 206, 306a-c can extend substantially entirely to at least a portion of the bonded contact pads 208a-c, 210a-c, 308a-c, 310a-c, such that there is substantially no gap between the nonconductive bonding regions at or near the bonded contact pads 208a-c, 210a-c, 308a-c, 310a-c. In some embodiments, a barrier layer (not shown) may be provided under the contact pads 208a-c, 210a-c, 308a-c, 310a-c (e.g., which may include copper). In other embodiments, however, there may be no barrier layer under the contact pads 208a-c, 210a-c, 308a-c, 310a-c, for example, as described in U.S. Patent Application Publication No. US 2019/0096741, which is incorporated by reference herein in its entirety and for all purposes.

Although the illustrated embodiments show directly bonded optical elements, in other embodiments, the optical devices can be attached to the carrier(s) with an adhesive, e.g., a transparent adhesive.

Figure 6:
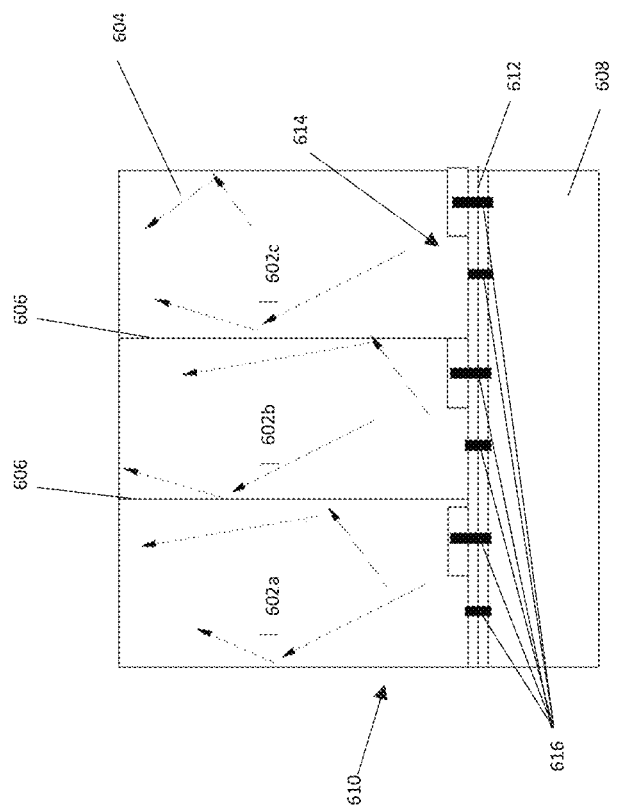
FIG. 6 is a diagram showing an illustration of physical separation between pixels within an optical device, according to an embodiment.

As illustrated and described herein, in some embodiments, the bonded optical device 200, 300a-c can comprise an optical element 202a-c, 302a-c that includes a plurality of image regions or display regions (e.g., pixels 602a-c as shown in FIG. 6). Each image region can comprise a monochromatic image region that includes an optical emitter 614 configured to emit light of a single color. The optical emitter 614 can comprise a light emitting diode, which can emit light from the region or surface in the optical element in which the LED is formed. The optical element 202a-c, 302a-c may comprise a LED wafer comprising Group III-V materials, e.g. GaAs, GaN, GaP, InGaN, AlGaInP, AlGaAs, etc. For example, the optical element 202a-c, 302a-c can comprise monochromatic LED chips in various embodiments. The LED chips can each be configured to emit light of a single color. The LED chips can be configured to emit different colors from one another. For example, a first LED chip (such as the optical element 202a) can be configured to emit red light, a second LED chip (such as the optical element 202b) can be configured to emit green light, and a third LED chip (such as the optical element 202c) can be configured to emit blue light. It should be appreciated that the LED chips can emit any suitable colors.

The optical element 202a-c, 302a-c can be bonded, e.g., directly bonded without an intervening adhesive, to at least one carrier 204, 304a-c (for example, at least one processor element) that has active circuitry for controlling operation of pixels of the optical element 202a-c, 302a-c. The at least one carrier 204, 304a-c can comprise a semiconductor element, such as silicon, in various arrangements. For example, the carrier 204, 304a-c can serve as a silicon-based backplane in some embodiments. The carrier 204, 304a-c can comprise a processor die having driver circuitry electrically connected to the optical emitters by way of the contact pads 208a-c, 210a-c, 308a-c, 310a-c. The driver circuitry can control the emission of light from the plurality of optical emitters of the optical element 202a-c, 302a-c.

As explained herein, the plurality of image regions (such as the pixels 602a-c shown in FIG. 6) can be arranged relative to one another and to a common optical pathway (such as an optical waveguide 804 shown in FIG. 8) such that monochromatic light from each image region is coupled into the optical pathway. In some embodiments, a plurality of such bonded optical devices 200, 300a-c can be coupled with the common optical pathway. The plurality of bonded optical devices 200, 300a-c can be configured to emit light of different colors (e.g., a red bonded optical device, a green bonded optical device, a blue bonded optical device). A superimposed light beam from the plurality of bonded optical devices can be transferred along the optical pathway to an optical output to be viewed by a user. A plurality of monochromatic images can be superimposed into a polychromatic image in the waveguide representative of the combined contribution of the pixels each of the plurality of bonded optical devices.

In various embodiments, the superposition of light from multiple monochromatic image regions can provide redundancy in case one image region is damaged or unused. In such cases, light from the other pixels can compensate for the color of light in the damaged image region.

Beneficially, the embodiments disclosed herein can utilize bonded optical elements 202a-c, 302a-c that include an array or pixels of multiple LEDs, without separately singulating and repopulating the singulated LEDs on a substrate. The array of LED chips can be directly bonded to an array of processing elements configured to control operation of the LEDs. By contrast, in other methods, each LED pixel can be singulated and stacked on a substrate at higher pitches, which can complicate assembly processes. The use of directly bonded optical elements including an array of LEDs can accordingly improve manufacturability of display devices. In one example the array of red (R), Green (G) and Blue (B) LED wafers are each separately direct or hybrid bonded to silicon (Si) backplane or imager wafers. These stacks can then be singulated to form red, green and blue monochromatic imagers, which could be combined to form a multi-colored image. In another example, red, green, and blue LED wafers can be separately singulated to form R, G, B LED chips and can be direct bonded to one silicon backplane or imager. Elements in a silicon backplane can be electrically connected to LED pixels within R, G, B chips to achieve pixel level control. Although LED wafers can be direct or hybrid bonded to a silicon backplane, any other suitable backplane (e.g., a Thin Film Transistor, or TFT) backplane may also be used. In some embodiments, as explained herein, an optical assembly can comprise at least one red LED chip, at least one green LED chip, and at least one blue LED chip. In some embodiments, an optical system can comprise a plurality or an array of multiple such optical assemblies to direct image data to the user.

In some embodiments, the monochromatic image regions can be oriented parallel to one another. For example, in some embodiments, the image regions can be positioned laterally side-by-side on a waveguide. Light from the image regions can be coupled into the waveguide, and the waveguide can transmit a superimposed image of multiple colors to the user. In other embodiments, the image regions can be positioned non-parallel to one another (e.g., perpendicular to one another), and combiner optics can be provided to transmit a superimposed image of multiple colors to the user.

FIG. 4 is a schematic side sectional view of an optical assembly of combined optical devices (e.g., monochromatic emitter chips), according to one embodiment. The optical assembly 400 includes a plurality of optical devices 400a-c formed by a plurality of optical elements 402a-c (such as, e.g., monochromatic LED chips) directly bonded to a corresponding plurality of carrier elements 404a-c (such as, e.g., silicon-based backplane). The optical assembly 400 can include as a redirection element or mirroring apparatus 406a-b (e.g., a mirror, beamsplitter or other suitable optical redirection device) and an optical combiner apparatus 408 (e.g., a lens).

In one embodiment, the optical devices 400a-c (including the optical elements 402a-c (e.g., monochromatic LED chips, for example, for R, G, B, respectively) with corresponding carrier elements 404a-c (e.g., silicon backplane) can be combined to form a colored image or portion of a colored image. That is, instead of for example RGB microLED displays, separate monochromatic LED chips can be combined as shown in FIG. 4. With three (3) displays used, issues such as gang bonding of millions of pixels are not a concern. Multiple optical assemblies 400 may be incorporated in an array in various optical systems.

In one implementation, the bonded optical devices 400a-c can be oriented at an angle relative to one another. For example, the optical elements 402a-c can be approximately perpendicular to one another. In another implementation, the optical elements 402a-c can form a prescribed angle that is greater or less than 90° relative to one another. The optical devices 400a-c can each be mounted on a frame or other structure (not shown) and aligned relative to one or more mirroring apparatus 406a-b (which can be for example beam splitters for redirecting light). As shown in FIG. 4, the mirroring apparatus 406a-b can redirect the light from the optical elements 402a-c along a common channel so as to superimpose the colored light from each optical element 402a-c. The light from each optical element 402a-c can be varied, based on for example control via the circuitry of the carrier elements 404a-c, so as to generate a superimposed light of various colors. The image data of the light from each optical element 402a-c can pass through an optical combiner apparatus 408 (e.g., a lens) to collect the light and transfer it to the user.

In one implementation, hybrid direct bonding (such as DBI®) can be implemented to bond the carrier elements 404a-c (e.g., CMOS circuit) to control each pixel/diode at ~5 µm pitch with the optical elements 402a-c such as large R, G and B chips based on the size of the display.

In another implementation, the colors as produced by the optical elements 402a-c as driven by the carrier elements 404a-c can be used to deliver an image or portion of an image to the user's eye by the optical combiner apparatus 408 (such as via curved combiners or waveguides).

In other implementations, D2D, W2W or D2W bonding can be used, based on the application.

Figure 5:
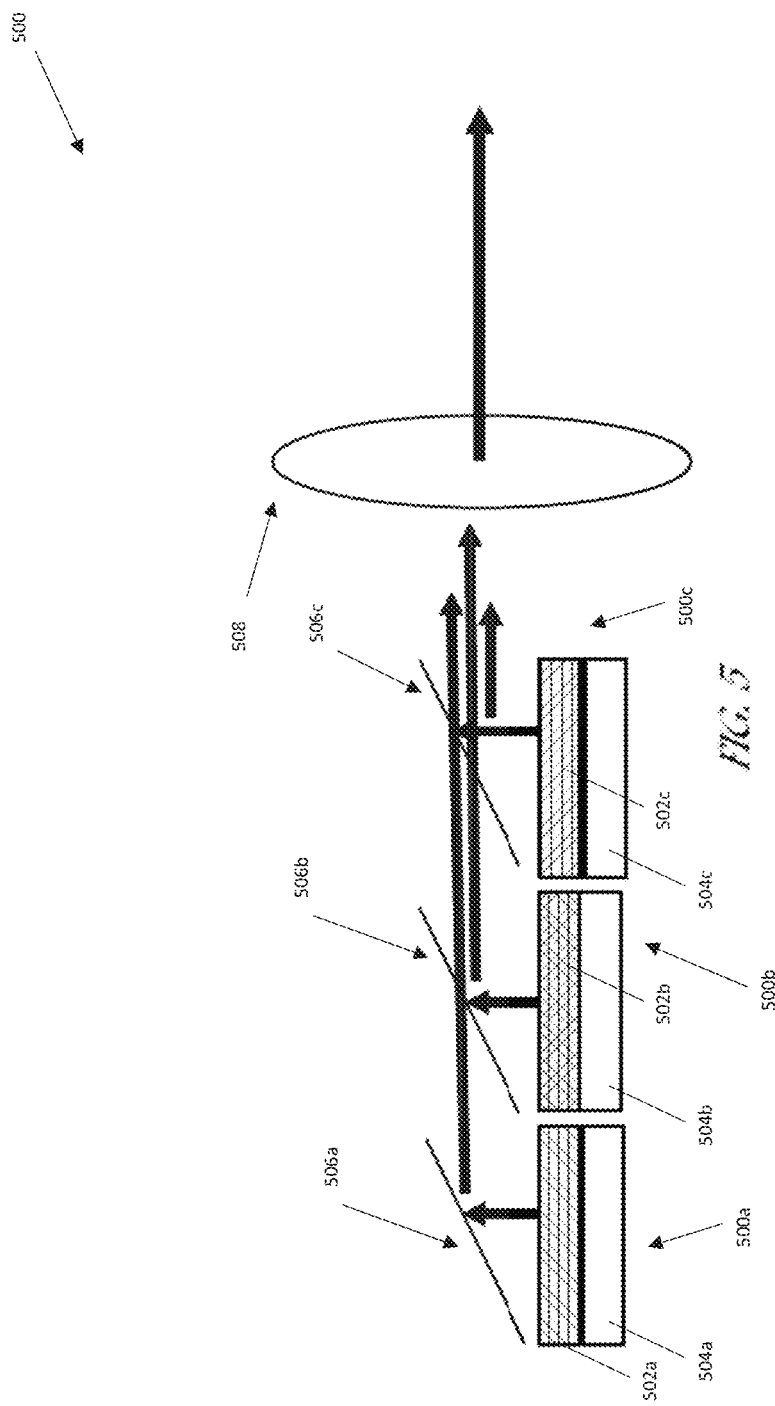
FIG. 5 is a schematic side sectional view of an optical assembly, according to another embodiment.

FIG. 5 is a schematic side sectional view of an optical assembly including combined optical devices, according to another embodiment. The optical assembly 500 includes individual optical elements 502a-c (e.g., optical wafers, etc.) and carrier elements 504a-c, as well as mirroring apparatus 506a-c and optical combiner apparatus 508.

As shown, the individual optical elements (such as for example R, G, B wafers) 502a-c can be stacked on carrier elements 504a-c and singulated to form three (3) large optical devices such as monochromatic display chips with for example size of 5 mm×8 mm.

In one embodiment, the optical elements 502a-c can be placed side-by-side. In some embodiments, the optical elements 502a-c can be mounted on a common carrier (not shown). In other embodiments, the optical elements 502a-502c can be mounted on separate carrier elements 504a-c to form the optical devices 500a-c.

In one implementation, the optical devices 500a-c can be arranged (e.g., mounted on a frame or structure) so as to be laterally offset by a predetermined amount. In such arrangement, the optical elements 502a-c are laterally offset from one another by a predetermined distance, along a direction that is parallel to a major surface of at least one carrier element 504a-c. Here, the emission surfaces can also be parallel to one another. In another implementation, the emission surfaces may not be parallel to one another, but may instead be angled relative to one another.

As shown, the light from each optical element 502a-c can be redirected by the corresponding mirroring apparatus 506a-c, so as to superimpose the image data, which can be collected via the optical combiner apparatus 508 (e.g., combiner optics such as a lens) to produce various colors. The light from each optical element 502a-c can be varied based on the control via the carrier elements 504a-c, so as to produce different colors based on how much of each color from each optical element 502a-c is emitted and then combined.

FIG. 6 is a diagram showing an illustration of physical separation between pixels within an optical device. It includes a plurality of pixels 602a-c, a plurality of light guides 604, a plurality of physical separations 606, a carrier element 608, an optical element 610, a bond interface 612 between the carrier element 608 and optical element 610, a plurality of emitters 614 (light emitting regions), and a plurality of contact pads 616 of the carrier element 608 and the optical element 610. Light can be emitted from the light emitting surface of the emitters 614, and can propagate through the pixel regions as shown.

In various embodiments, each pixel 602a-c (e.g., monochromatic image region) can comprise one or a plurality of optical physical isolation or pixel isolation structures configured to limit crosstalk between neighboring regions of the optical element 610. For example, the isolation structures can comprise trenches formed through at least a portion of the optical element 610. The isolation structures may be similar to the deep trench isolation structures implemented in back side illuminated image sensors.

As shown, in one embodiment, the physical separation 606 between pixels 602a-c within an optical element 610, such as a chip, can comprise deep trench isolation features for integrated microLED arrays. Such deep trench isolation features can prevent light received by one pixel from going into another, microLEDs can also be fabricated such that light 604 generated by one diode/pixel is not scattered internally to the neighboring pixel/diode, based for example on the physical separation 606. Based on such individually controllable pixel 602a-c, light emitted via the emitter 614 (which can be configured to emit light of a single prescribed color, and make up or define at least a part of the pixel 602a-c) from for example one pixel 602c is physically isolated from the adjacent pixel 602b by the physical separation 606.

Figure 7:
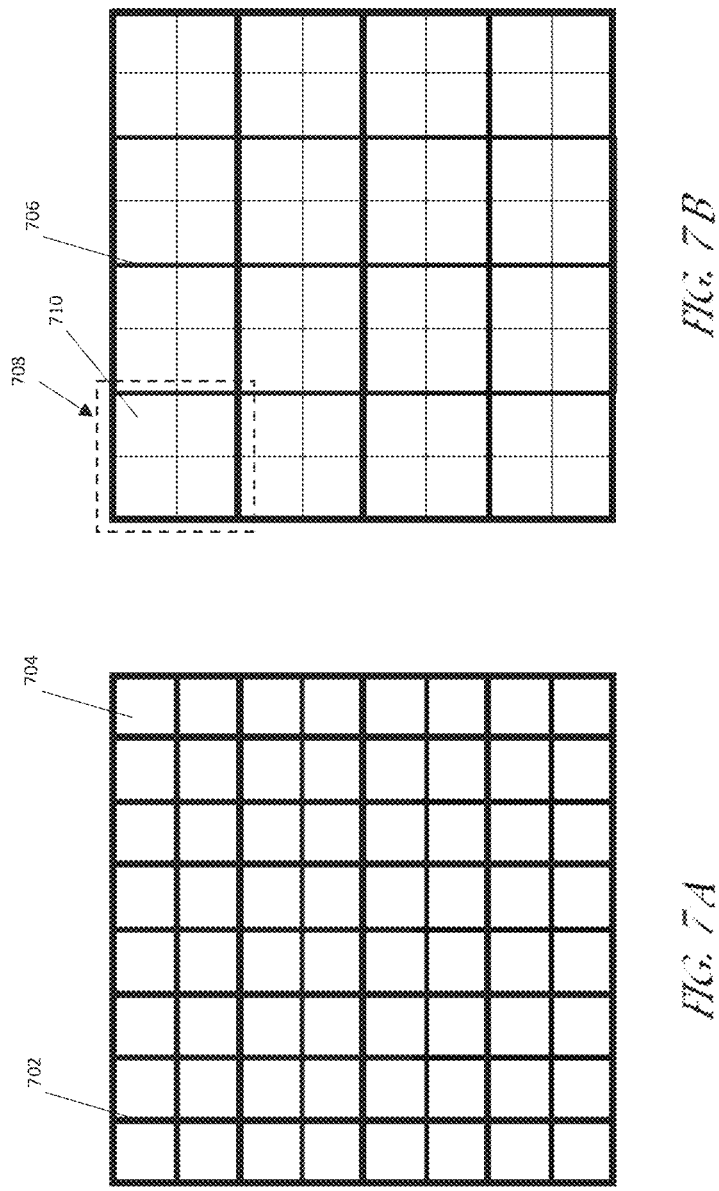
FIG. 7A is a diagram showing an illustration of physical separation between individual pixels of an optical device, according to an embodiment.
FIG. 7B is a diagram showing an illustration of physical separation only in an A×A matrix of pixels within an optical device, according to an embodiment.

FIGS. 7A and 7B are diagrams showing different embodiments with different physical separations. FIG. 7A is a diagram showing an illustration of physical separation 702 between every pixel 704, and FIG. 7B is a diagram showing an illustration of physical separation 706 only in A×A matrix (for example, 2×2, 3×3, etc.) 708 of pixels 710. The embodiment of FIG. 7B can produce a high yield because one (1) malfunctioning pixel may not be a concern for, e.g., the light emitted, since the physical separation is between the A×A matrices 708 rather than individual pixels 710. Such embodiment can also enable improved control of, e.g., brightness of the light emitted. The processor element(s) (e.g., a CMOS or Si back plane) can control a selected number of pixels from the matrix 708 to turn ON or OFF to control brightness, such that the matrix 708 can serve as one large pixel of a display comprising several smaller pixels 710. Thus, in various embodiments, the processor element(s) can independently control the pixels 710 as part of the matrix 708 to create desired image data, in which the matrix 708 can serve as a larger pixel and the pixels 710 can serve as sub-pixels. The pixels 710 in an optical element can accordingly be divided into matrices of pixels, and the processor element(s) can accordingly be configured to selectively control the brightness of pixels within each matrix. In various embodiments, the isolation features can be configured to optically separate (e.g., prevent crosstalk) between adjacent matrices 708 of pixels 710. In some embodiments, adjacent pixels 710 within a matrix 708 may not be separated by isolation features. In other embodiments, adjacent pixels 710 may be separated by isolation features.

Figure 8:
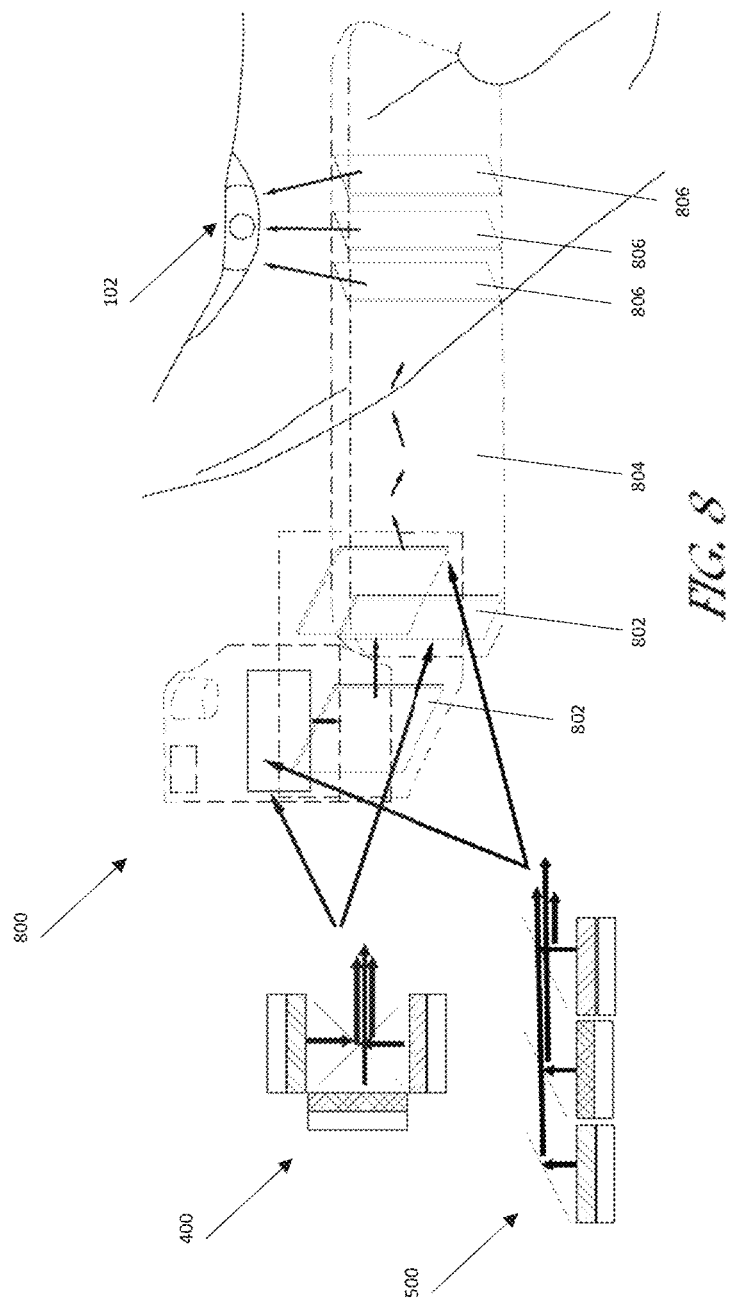
FIG. 8 is a diagram showing an optical system that can incorporate the optical assemblies described herein, according to an embodiment.

FIG. 8 is a diagram showing an optical system 800 configured to direct light to a waveguide. It includes input coupling 802, a waveguide 804, and output coupling 806.

In one embodiment, the optical assemblies 400 and/or 500 such as with the optical assemblies of combined LED-CMOS structure (including monochromatic microLED display) described herein can be attached as separate units or mounted directly (for example via a plurality of input couplings 802) on the waveguide 804 in direct, side or angular configuration. In one or more implementations, this can be implemented in for example projectors (projection systems), car HUDs, smart watch displays, and cell phone displays, which include a plurality of output couplings 806, used to transmit the image data to the user's eye 102.

Figure 9:
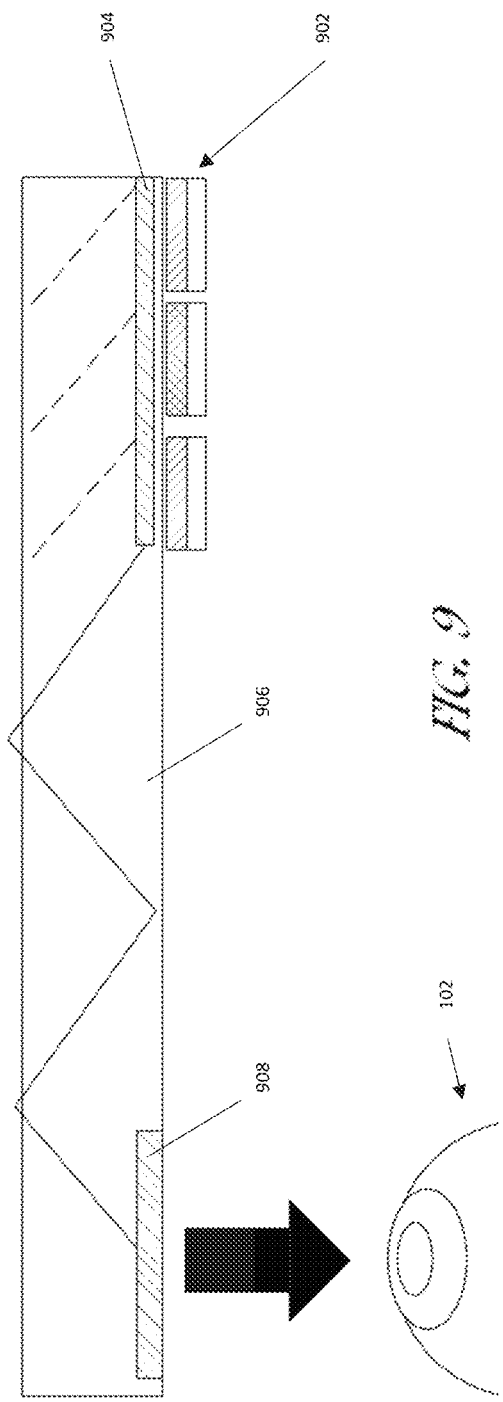
FIG. 9 is a diagram showing optical devices directly bonded to a waveguide with input and output couplings, according to an embodiment.
Figure 10:
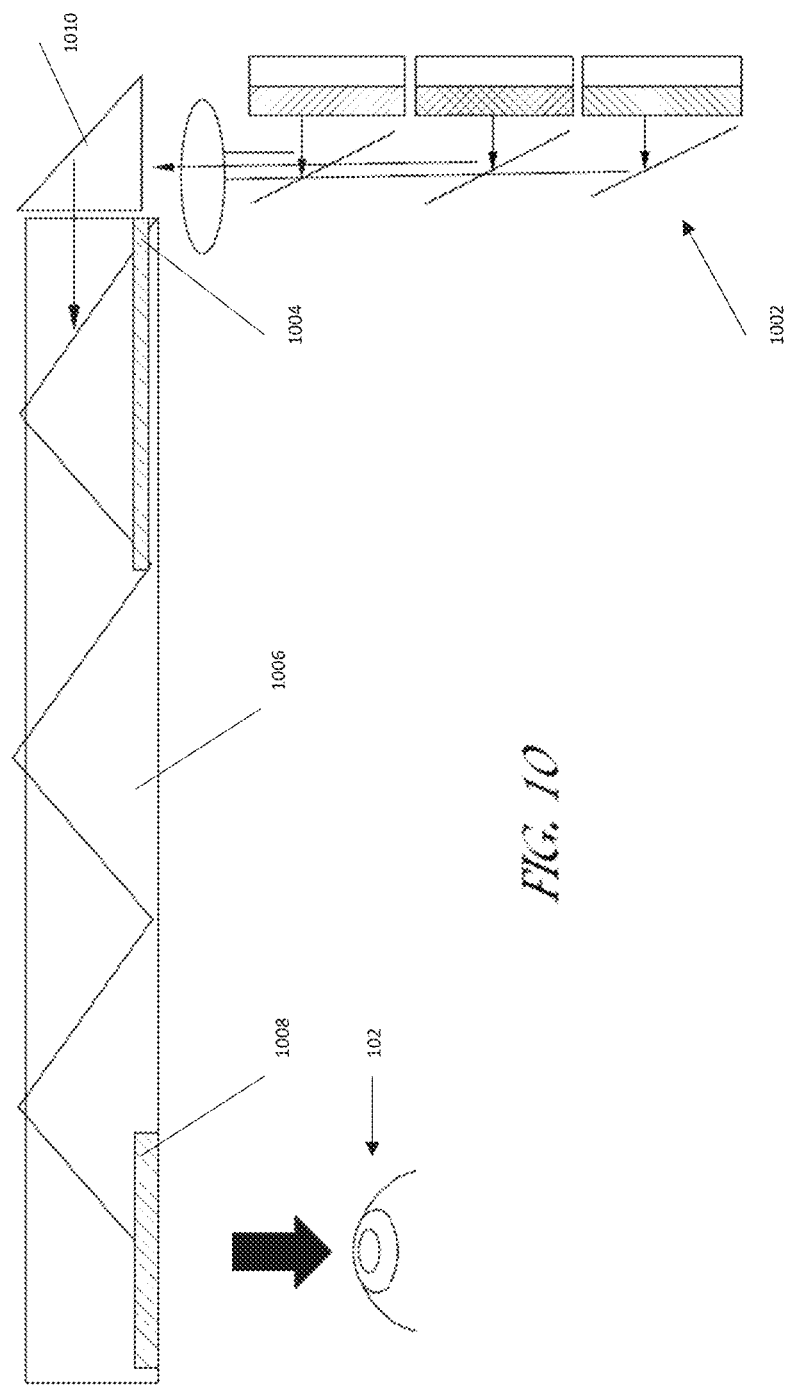
FIG. 10 is a diagram showing optical devices configured to direct light to a waveguide with input and output couplings, according to another embodiment.

FIGS. 9 and 10 are diagrams showing optical devices such as microLEDs directly bonded to a waveguide 906, 1006 with input and output couplings. The devices each include optical assembly 902, 1002 (described in detail herein with respect to for examples FIGS. 2-3) configured to couple light to the waveguide 906, 1006, with input coupling (904 and 1004, respectively) and to the user with output coupling (908 and 1008, respectively). In some embodiments (e.g., FIG. 9), the bonded optical devices (e.g., the assembly 902) can be directly bonded to the waveguide 906 without an intervening adhesive to mechanically and optically couple the optical devices to the waveguide 906. In other embodiments, the optical assembly can be mounted to a frame or other structure that connects to the waveguides.

The input coupling 904, 1004 allows the image data from the optical assembly 902, 1002 to enter the waveguide 906, 1006 (for example made of dielectric material), which is used to transfer the image data via light (including superimposed light emitted from the optical assembly 902, 1002 via for example a corresponding array of emitters) travelling through the waveguide 906, 1006 by for example total internal reflection (TIR) and to the user's eye 102 via the output coupling 908, 1008.

In one embodiment, as shown in FIG. 10, an optical apparatus 1010 (such as for example a prism) can be used to redirect the light transmitted from the optical assembly 1002, so as to enable the light to travel through the waveguide 1006. In some embodiments, the optical assembly 1002 can be mounted to another structure that is angled relative to the waveguide 1006, and light can be redirected to the optical apparatus 1010 by way of mirrors and combiner optics as shown.

Figure 11:
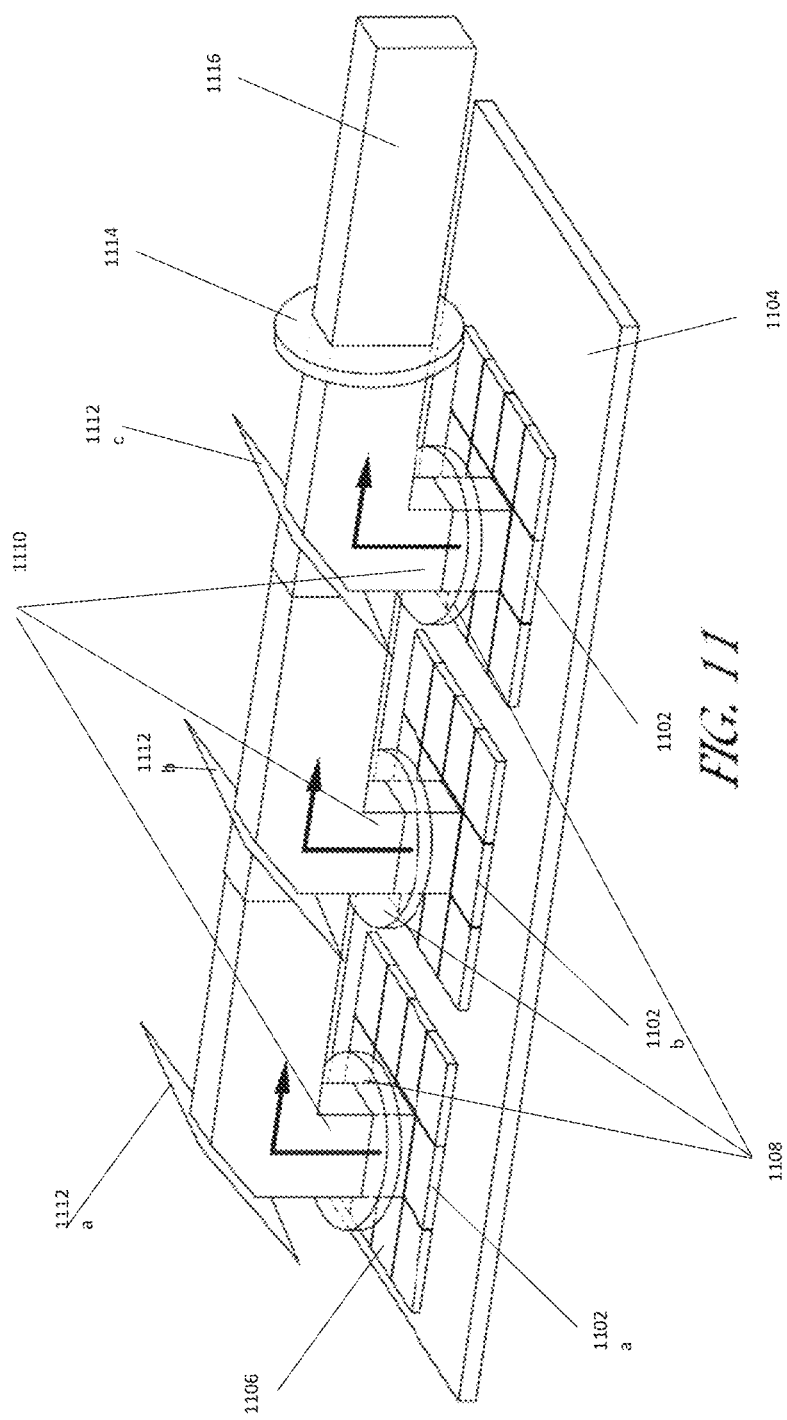
FIG. 11 is a diagram showing an illustration of superposition of three color pixels.

FIG. 11 is a diagram showing an illustration of superposition of three color pixels. It includes a plurality of optical elements (e.g., LED die (R, G, B)) 1102a-c including a plurality of pixels 1106, a carrier element 1104, a plurality of optical combining elements 1108 (e.g., lenses), a plurality of connecting waveguides 1110, a plurality of mirroring apparatus 1112a-c, an optical combiner apparatus 1114, and a waveguide 1116.

In one embodiment, the plurality of optical elements 1102a-c can emit, via a plurality of emitters (not shown) monochromatic light, which can travel through the corresponding optical combining element 1108 and connecting waveguide 1110, to be reflected by the corresponding mirroring apparatus 1112a-c. As shown, the plurality of optical elements 1102a-c can be disposed between the carrier element 1104 and the waveguide 1116. The optical elements 1102a-c can be directly bonded to the carrier element 1104 without an intervening adhesive. Furthermore, the mirroring apparatus 1112a-c can be arranged at an angle relative to connecting waveguides 1110, so as to direct the incoming lights through the optical combiner apparatus 1114 and the waveguide 1116 to the user's eye (not shown).

In one embodiment, the carrier element 1104 is a silicon/glass carrier, or an active silicon die driving the pixels 1106 and the optical elements (such as for example LED die) 1102a-c in another embodiment. In some embodiments, the optical elements can be directly bonded to the waveguide, e.g., to the connecting waveguide 1110, without an intervening adhesive. In other embodiments, the optical elements can be attached to the waveguide with a transparent adhesive.

Thus, in various embodiments, a bonded optical device is disclosed. The bonded optical device can include a first optical element having a first array of optical emitters configured to emit light of a first color. The first optical element can be bonded to at least one processor element, the at least one processor element comprising active circuitry configured to control operation of the first optical element. The bonded optical device can include a second optical element having a second array of optical emitters configured to emit light of a second color different from the first color. The second optical element can be bonded to the at least one processor element. The at least one processor element can comprise active circuitry configured to control operation of the second optical element. The bonded optical device can include an optical pathway optically coupled with the first and second optical elements, the optical pathway configured to transmit a superposition of light from the first and second optical emitters to an optical output to be viewed by a user.

In some embodiments, the first optical element is directly bonded to the at least one processor element without an intervening adhesive, and the second optical element is directly bonded to the at least one processor element without an intervening adhesive. Respective dielectric bonding surfaces of the first optical element and the at least one processor element can be directly bonded to one another without an intervening adhesive. Respective conductive contact pads of the first optical element and the at least one processor element can be directly bonded to one another without an intervening adhesive. Each optical emitter of the first and second arrays of optical emitters can be electrically connected to a corresponding driver circuit on the at least one processor element.

In some embodiments, a first optical emitter of the first array of optical emitters and a second optical emitter of the second array of optical emitters at least partially define a pixel, and the optical pathway can be configured to transmit a superposition of the light from the first and second optical emitters of the pixel. The at least one processor element can comprise a first processor element and a second processor element separate from the first processor element. The first optical element can be bonded to the first processor element and the second optical element can be bonded to the second processor element. In some embodiments, the at least one processor element comprises a common carrier.

In various embodiments, the optical pathway comprises an optical waveguide. The first optical element can be disposed between the optical waveguide and the first processor element. The second optical element can be disposed between the optical waveguide and the second processor element. In some embodiments, the first and second optical elements are directly bonded to the optical waveguide without an intervening adhesive. In some embodiments, the first and second optical elements are bonded with one or more adhesives transparent to the respective first and second colors of light.

In some embodiments, the first and second optical elements can be laterally offset from one another along a direction parallel to a major surface of the at least one processor element. In some embodiments, respective emission surfaces of the first and second optical elements can be generally parallel to one another. In some embodiments, respective emission surfaces of the first and second optical elements can be disposed non-parallel to one another.

The bonded optical device can include one or a plurality of optical isolation structures in the first optical element. The optical isolation structures can be configured to limit crosstalk between adjacent optical emitters.

In some embodiments, the first color has a first peak at a first wavelength, the second color has a second peak at a second wavelength. A difference between the first and second wavelengths can be at least 25 nm. Thus, in various embodiments, the wavelengths can be separated by a sufficient amount such that the colors emitted by the optical elements can be distinguishable from one another. In some embodiments, the optical pathway can include one or more redirection elements (e.g., mirrors, beamsplitters, etc.) to redirect light from the first and second image regions. In some embodiments, the optical pathway comprises a lens configured to act upon the superimposed light.

The bonded optical device can include a third optical element optically coupled with the optical pathway and bonded to the at least one processor element. The third optical element can be configured to emit light of a third color that is different from the first and second colors. The first, second, and third colors can comprise red, green, and blue, respectively. In various embodiments, the optical emitters of the first array are independently controllable. The first and second arrays of optical emitters can comprise respective arrays of light emitting diodes (LEDs). A pitch of the optical emitters of the first array can be less than 50 microns. A pitch of the optical emitters of the first array can be less than 10 microns.

In another embodiment, a bonded optical device is disclosed. The bonded optical device can include a first optical element directly bonded to at least one carrier without an adhesive, the first optical element configured to emit light of a first color. The bonded optical device can include a second optical element directly bonded to the at least one carrier without an adhesive. The second optical element can be configured to emit light of a second color different from the first color. The first and second optical elements can be laterally offset from one another along a direction parallel to a major surface of the at least one carrier. The bonded optical device can include an optical pathway optically coupled with the first and second optical elements, the optical pathway configured to transmit a superposition of light from the first and second optical elements to an optical output to be viewed by a user.

In some embodiments, the at least one carrier comprises a first carrier and a second carrier separate from the first carrier. In some embodiments, the at least one carrier comprises at least one processor element comprising active circuitry configured to control operation of at least one of the first and second optical elements. In some embodiments, the first optical element can be directly bonded to the at least one carrier without an intervening adhesive, and the second optical element can be directly bonded to the at least one carrier without an intervening adhesive. In some embodiments, respective dielectric bonding surfaces of the first optical element and the at least one carrier are directly bonded to one another without an intervening adhesive. In some embodiments, respective conductive contact pads of the first optical element and the at least one carrier are directly bonded to one another without an intervening adhesive. In various embodiments, the at least one carrier comprises at least one of silicon or glass. In some embodiments, the at least one carrier can have a coefficient of thermal expansion (CTE) less than 7 ppm.

In some embodiments, the optical pathway can comprise an optical waveguide. In some embodiments, a third optical element can be optically coupled with the optical pathway. The third optical element can be directly bonded to the at least one carrier without an adhesive. The third optical element can be configured to emit light of a third color that is different from the first and second colors.

In some embodiments, the first, second, and third colors comprise red, green, and blue, respectively. The first and second optical elements can comprise respective arrays of optical emitters. The optical emitters can be independently controllable. The optical emitters can comprise light emitting diodes (LEDs).

In another embodiment, a method of bonding at least one optical element with at least one processor element is disclosed. The method can include bonding a first optical element with to at least one processor element, wherein the first optical element comprises a first array of optical emitters configured to emit light of a first color, and the at least one processor element comprises active circuitry configured to control operation of the first optical element; bonding a second optical element with to the at least one processor element, wherein the second optical element comprises a second array of optical emitters configured to emit light of a second color different from the first color, and the at least one processor element comprises active circuitry further configured to control operation of the second optical element; and coupling the first and second optical elements with an optical pathway, the optical pathway configured to transmit a superposition of light from the first and second optical emitters to an optical output to be viewed by a user. In some embodiments, the at least one carrier comprises a processor die.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A bonded optical device comprising:
   a first optical element having a first dielectric bonding surface, a first plurality of contact pads, a plurality of pixels having at least a first pixel and a second pixel, and a first array of optical emitters configured to emit light of a first color, the first array of optical emitters having at least a first optical emitter and a second optical emitter, wherein the first pixel comprises light emitted from the first optical emitter and the second pixel comprises light emitted from the second optical emitter, and at least one optical isolation structure disposed between the first pixel and the second pixel; and
   at least one processor element comprising a second dielectric bonding surface, a second plurality of contact pads, and active circuitry configured to control operation of an individual optical emitter of the first array of optical emitters,
   wherein the first and second dielectric bonding surfaces are directly bonded without an intervening adhesive and the first and second plurality of contact pads are directly bonded and electrically connected to one another without an intervening adhesive.

2. The bonded optical device of claim 1, further comprising a second optical element having a second array of optical emitters configured to emit light of a second color different from the first color and a third dielectric bonding surface, wherein the at least one processor element comprises active circuitry configured to control operation of the second optical element, and wherein the second and third dielectric bonding surfaces are directly bonded without an intervening adhesive.

3. The bonded optical device of claim 1, further comprising an optical pathway optically coupled with the first and second optical elements, the optical pathway configured to transmit a superposition of light from the first and second arrays of optical emitters to an optical output to be viewed by a user.

4. The bonded optical device of claim 3, wherein the optical pathway comprises a lens configured to act upon the superposition of light.

5. The bonded optical device of claim 3, further comprising a third optical element having a third array of optical emitters configured to emit light of a third color different from the first and second colors and a fourth dielectric bonding surface, the fourth dielectric bonding surface directly bonded to the second dielectric bonding surface of the at least one processor element, the at least one processor element comprising active circuitry configured to control operation of the third optical element, and the optical pathway optically coupled with the first, second, and third optical elements, the optical pathway configured to transmit a superposition of light from the first, second, and third arrays of optical emitters to the optical output to be viewed by the user.

6. The bonded optical device of claim 3, wherein the first and second optical elements are laterally offset from one another along a direction parallel to a major surface of the at least one processor element, wherein respective emission surfaces of the first and second optical elements are generally parallel to one another.

7. The bonded optical device of claim 3, wherein respective emission surfaces of the first and second optical elements are disposed non-parallel to one another.

8. The bonded optical device of claim 1, wherein the first array of optical emitters comprises a plurality of matrices, each matrix including a plurality of pixels, and wherein the at least one processor element is configured to selectively control a brightness of the plurality of pixels within each matrix.

9. The bonded optical device of claim 8, wherein the at least one optical isolation structure is disposed between adjacent matrices of the plurality of pixels.

10. The bonded optical device of claim 1, wherein the at least one optical isolation structure comprises a trench and is configured to limit crosstalk between adjacent optical emitters.

11. A method of forming a bonded optical device, the method comprising:
providing a first wafer comprising at least a first optical element and a second optical element, wherein the first optical element comprises a first dielectric bonding surface and a first array of optical emitters configured to emit light of a first color, and wherein the second optical element comprises a second array of optical emitters configured to emit light of a second color;
providing a second wafer comprising at least a first processor element and a second processor element, wherein the first processor element comprises a second dielectric bonding surface and a first active circuitry configured to control operation of the first optical element, and wherein the second processor element comprises a second active circuitry configured to control operation of the second optical element;
directly bonding the first wafer with the second wafer and forming a bonded wafer, wherein forming a bonded wafer further comprises directly bonding the first dielectric bonding surface of the first optical element with the second dielectric bonding surface of the first processor element without an intervening adhesive; and
dicing the bonded wafer.

12. The method of claim 11, further comprising providing a first plurality of conductive contact pads at a first side of the first optical element, the first side further comprising the first dielectric bonding surface, providing a second plurality of conductive contact pads at a second side of the first processor element, the second side further comprising the second dielectric bonding surface, and directly bonding the first plurality of conductive contact pads to the second plurality of conductive contact pads without an intervening adhesive.

13. The method of claim 11, further comprising coupling the first and second optical elements after dicing the bonded wafer with an optical pathway, wherein the optical pathway is configured to transmit a superposition of light from the first and second optical emitters to an optical output to be viewed by a user.

14. The method of claim 13, wherein a first optical emitter of the first array of optical emitters and a second optical emitter of the second array of optical emitters at least partially define a pixel, and wherein the optical pathway is configured to transmit the superposition of light from the first and the second optical emitters of the pixel.

15. The method of claim 11, further comprising electrically connecting each optical emitter of the first and second arrays of optical emitters to a corresponding driver circuit on at least the first and the second processor elements.

16. The method of claim 11, further comprising after dicing the bonded wafer, laterally offsetting the first and second optical elements from one another along a direction parallel to a major surface of the at least one processor element, wherein respective emission surfaces of the first and second optical elements are generally parallel to one another.

17. The method of claim 11, further comprising after dicing the bonded wafer, disposing respective emission surfaces of the first and second optical elements non-parallel to one another.

18. The method of claim 11, wherein at least one optical emitter of the first array of optical emitters is independently controllable.

19. The method of claim of claim 11, wherein a pitch of optical emitters of the first array of optical emitters is less than 10 microns.

20. The method of claim 11, further comprising providing one or more isolation features, wherein the isolation features are configured to limit crosstalk between adjacent pixels or adjacent groups of pixels.

* * * * *